(12) United States Patent
Ohtsuka et al.

(10) Patent No.: US 9,059,193 B2
(45) Date of Patent: Jun. 16, 2015

(54) EPITAXIAL WAFER AND SEMICONDUCTOR ELEMENT

(75) Inventors: Kenichi Ohtsuka, Tokyo (JP); Kenichi Kuroda, Tokyo (JP); Hiroshi Watanabe, Tokyo (JP); Naoki Yutani, Tokyo (JP); Hiroaki Sumitani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/514,201

(22) PCT Filed: Dec. 27, 2010

(86) PCT No.: PCT/JP2010/007562
§ 371 (c)(1),
(2), (4) Date: Jun. 6, 2012

(87) PCT Pub. No.: WO2011/083552
PCT Pub. Date: Jul. 14, 2011

(65) Prior Publication Data
US 2012/0241766 A1 Sep. 27, 2012

(30) Foreign Application Priority Data
Jan. 8, 2010 (JP) .................................. 2010-002946

(51) Int. Cl.
*H01L 29/15* (2006.01)
*H01L 29/66* (2006.01)
(Continued)

(52) U.S. Cl.
CPC .......... *H01L 29/66068* (2013.01); *C30B 23/02* (2013.01); *C30B 25/02* (2013.01);
(Continued)

(58) Field of Classification Search
CPC ........ C30B 23/02; C30B 25/02; C30B 29/36; H01L 21/02378; H01L 21/02433; H01L 21/02447; H01L 21/02496; H01L 21/02529; H01L 21/02576; H01L 21/0495; H01L 29/107; H01L 29/1608; H01L 29/66068

USPC .............. 257/77, 15, 401; 438/459, 481, 570, 438/167
See application file for complete search history.

(56) References Cited

U.S. PATENT DOCUMENTS 6,673,662 B2 * 1/2004 Singh ............................ 438/167
7,468,314 B2 * 12/2008 Shenoy et al. ................ 438/570
(Continued)

FOREIGN PATENT DOCUMENTS

AU 4318600 11/2000
CN 1510764 A 7/2004
(Continued)

OTHER PUBLICATIONS

International Preliminary Report on Patentability issued Jul. 19, 2012 in PCT/JP2010/007562 filed Dec. 27, 2010 (with English-language translation).
(Continued)

*Primary Examiner* — Mohammed Shamsuzzaman
(74) *Attorney, Agent, or Firm* — Oblon, McClelland, Maier & Neustadt, L.L.P.

(57) ABSTRACT

A silicon carbide semiconductor element, including: i) an n-type silicon carbide substrate doped with a dopant, such as nitrogen, at a concentration C, wherein the substrate has a lattice constant that decreases with doping; ii) an n-type silicon carbide epitaxially-grown layer doped with the dopant, but at a smaller concentration than the substrate; and iii) an n-type buffer layer doped with the dopant, and arranged between the substrate and the epitaxially-grown layer, wherein the buffer layer has a multilayer structure in which two or more layers having the same thickness are laminated, and is configured such that, based on a number of layers (N) in the multilayer structure, a doping concentration of a K-th layer from a silicon carbide epitaxially-grown layer side is $C \cdot K/(N+1)$.

4 Claims, 2 Drawing Sheets

(51) Int. Cl.
  C30B 23/02    (2006.01)
  C30B 25/02    (2006.01)
  C30B 29/36    (2006.01)
  H01L 21/02    (2006.01)
  H01L 29/10    (2006.01)
  H01L 29/16    (2006.01)
  H01L 29/872   (2006.01)
  H01L 21/04    (2006.01)
  H01L 29/78    (2006.01)

(52) U.S. Cl.
  CPC ......... *C30B 29/36* (2013.01); *H01L 21/02378* (2013.01); *H01L 21/02433* (2013.01); *H01L 21/02447* (2013.01); *H01L 21/02496* (2013.01); *H01L 21/02529* (2013.01); *H01L 21/02576* (2013.01); *H01L 29/107* (2013.01); *H01L 29/1608* (2013.01); *H01L 29/872* (2013.01); *H01L 21/0495* (2013.01); *H01L 29/7827* (2013.01)

(56) References Cited

U.S. PATENT DOCUMENTS

| | | | | |
|---|---|---|---|---|
| 7,470,960 | B1 * | 12/2008 | Sugawara | ..................... 257/401 |
| 7,608,526 | B2 * | 10/2009 | Cody et al. | ..................... 438/481 |
| 7,825,401 | B2 * | 11/2010 | Cody et al. | ....................... 257/19 |
| 7,977,210 | B2 | 7/2011 | Ota et al. | |
| 8,203,150 | B2 | 6/2012 | Ohno et al. | |
| 2009/0133753 | A1 * | 5/2009 | Sasaki et al. | ................... 136/261 |
| 2009/0302328 | A1 * | 12/2009 | Ohno et al. | ..................... 257/77 |
| 2011/0140083 | A1 * | 6/2011 | Driscoll et al. | .................. 257/15 |
| 2013/0099253 | A1 * | 4/2013 | Ohtsuka et al. | ................. 257/77 |

FOREIGN PATENT DOCUMENTS

| | | |
|---|---|---|
| JP | 64-50480 A | 2/1989 |
| JP | 6-268202 A | 9/1994 |
| JP | 2000-319099 A | 11/2000 |
| JP | 2008-74661 A | 4/2008 |
| JP | 2009-130266 A | 6/2009 |
| JP | 2009-158788 A | 7/2009 |
| JP | 2009-295728 A | 12/2009 |

OTHER PUBLICATIONS

Written Opinion issued Mar. 8, 2011 in PCT/JP2010/007562 filed Dec. 27, 2010 (with English-language translation).
International Search Report issued Mar. 8, 2011 in PCT/JP2010/007562 filed Dec. 27, 2010.
Korean Office Action issued Sep. 24, 2013, in Korea Patent Application No. 10-2012-7017512 (with English translation).
Chinese Office Action issued Jun. 17, 2014, in China Patent Application No. 201080060769.2 (with English translation).
Office Action issued Dec. 31, 2014 in Chinese Patent Application No. 201080060769.2 (with a partial English translation).

\* cited by examiner

EPITAXIAL WAFER AND SEMICONDUCTOR ELEMENT

TECHNICAL FIELD

The present invention relates to an epitaxial wafer made of silicon carbide and a semiconductor element formed using the epitaxial wafer.

BACKGROUND ART

In semiconductor elements including a silicon carbide semiconductor, as an element structure, an epitaxially-grown layer grown on a low-resistance substrate is frequently used as an operating layer. In power semiconductor elements, an epitaxially-grown layer functions as a voltage sustaining layer, and the epitaxially-grown layer is normally formed as a single layer (for example, see Patent Document 1). In many cases, the epitaxially-grown layer has a thickness of 3 to 100 μm or more depending on a voltage for operation, and has a doping concentration on the order of $10^{16}$ cm$^{-3}$ at most or on the order of $10^{15}$ cm$^{-3}$ in many cases. On the contrary, a dopant of about $10^{19}$ cm$^{-3}$ is doped in a low-resistance crystal that becomes a substrate in many cases. Accordingly, the doping concentration differs considerably between the epitaxially-grown layer (voltage sustaining layer) and the substrate, which leads to a lattice constant difference therebetween. In a case where the epitaxially-grown layer has a larger thickness, the crystal quality of the epitaxially-grown layer degrades due to a lattice constant difference, that is, the introduction of a crystal defect accompanying lattice misfit. As a result, the carrier mobility decreases, leading to a problem of an increase in element resistance.

Therefore, as to the silicon carbide crystal having a (11-20) plane, it is disclosed that a buffer layer having a doping concentration of $2 \times 10^{15}$ to $3 \times 10^{19}$ cm$^{-3}$ and a layer thickness of 0.3 to 15 μm is provided between the substrate and the epitaxially-grown layer for mitigating the effects on the crystal quality due to a lattice constant difference, and it is described that a single layer film, stepwise gradient structure or continuous gradient structure in the range of the above-mentioned doping concentration and layer thickness is provided (for example, see Patent Document 2).

As to silicon carbide crystals having a (0001) plane and a (000-1) plane, it is described that as a buffer layer provided between a substrate and an epitaxially-grown layer, a plurality of layers having a doping concentration of approximately $\frac{1}{10}$ to $\frac{1}{2}$ of the doping concentration of a substrate serving as a ground are laminated to provide stepwise gradient film whose doping concentration changes stepwise for preventing the introduction of basal-plane dislocation into the epitaxially-grown layer (for example, see Patent Document 3).

PRIOR ART DOCUMENTS

Patent Documents

Patent Document 1: Japanese Patent Application Laid-Open No. 06-268202 (1994)
Patent Document 2: Japanese Patent Application Laid-Open No. 2000-319099
Patent Document 3: Japanese Patent Application Laid-Open No. 2008-74661

DISCLOSURE OF INVENTION

Problem to be Solved by the Invention

As to the epitaxial wafer and semiconductor element formed of a conventional silicon carbide semiconductor as described above, it is disclosed that a single layer film, or a buffer layer having a stepwise gradient structure or continuous gradient structure whose doping concentration changes stepwise or continuously is provided between a substrate and an epitaxially-grown layer that becomes a voltage sustaining layer. However, an appropriate configuration according to the types or concentrations of dopants of a substrate and an epitaxially-grown layer is not described. In particular, the configuration of the buffer layer in which the direction of lattice misfit caused by a dopant to be added is taken into consideration is not described as to the buffer layer having a stepwise gradient structure and the buffer layer having a continuous gradient structure. Accordingly, in the conventional silicon carbide epitaxial wafer and semiconductor element, the crystal quality of an epitaxially-grown layer degrades and the carrier mobility decreases at times.

The present invention has been made to solve the above-mentioned problem, and has an object to achieve an epitaxial wafer and a semiconductor element that improve the crystal quality of an epitaxially-grown layer more compared with a conventional case, do not experience a decrease in carrier mobility even in a case where an epitaxially-grown layer having a large film thickness is formed, and have a small element resistance.

Means to Solve the Problem

An epitaxial wafer and a semiconductor element according to the present invention include: a silicon carbide substrate of a first conductivity type in which a dopant having a lattice constant that decreases by doping is doped at a concentration C; a buffer layer of the first conductivity type located on the silicon carbide substrate, in which the dopant is doped; and a silicon carbide epitaxially-grown layer of the first conductivity type located on the buffer layer, in which the dopant is doped at a concentration smaller than the concentration of the silicon carbide substrate, wherein the buffer layer is formed to have a multi-layer structure including laminated two or more layers having approximately the same thickness, and a doping concentration of a K-th layer from the silicon carbide epitaxially-grown layer side is $C \cdot K/(N+1)$ where N represents the number of layers of the multi-layer structure.

Effects of the Invention

According to the present invention, the lattice misfit between a silicon carbide substrate and epitaxial growth can be mitigated effectively, which prevents the introduction of a crystal defect caused by a lattice constant difference between the silicon carbide substrate and the epitaxially-grown layer into the epitaxially-grown layer. As a result, the crystal quality of the epitaxially-grown layer is prevented from degrading, whereby it is possible to obtain an epitaxial wafer and a semiconductor element that prevent the crystal quality of an epitaxially-grown layer from degrading, do not experience a decrease in carrier mobility even in a case where an epitaxially-grown layer having a large film thickness is formed, and have a small element resistance.

EMBODIMENTS FOR CARRYING OUT THE INVENTION

Embodiments of the present invention are described below with reference to the drawings. While minus signs indicating minus indices are typically given to the upper portion of the indices in the notation of Mirror indices showing a crystal plane, in this specification, negative signs are prefixed to indices.

First Embodiment

Figure 1:
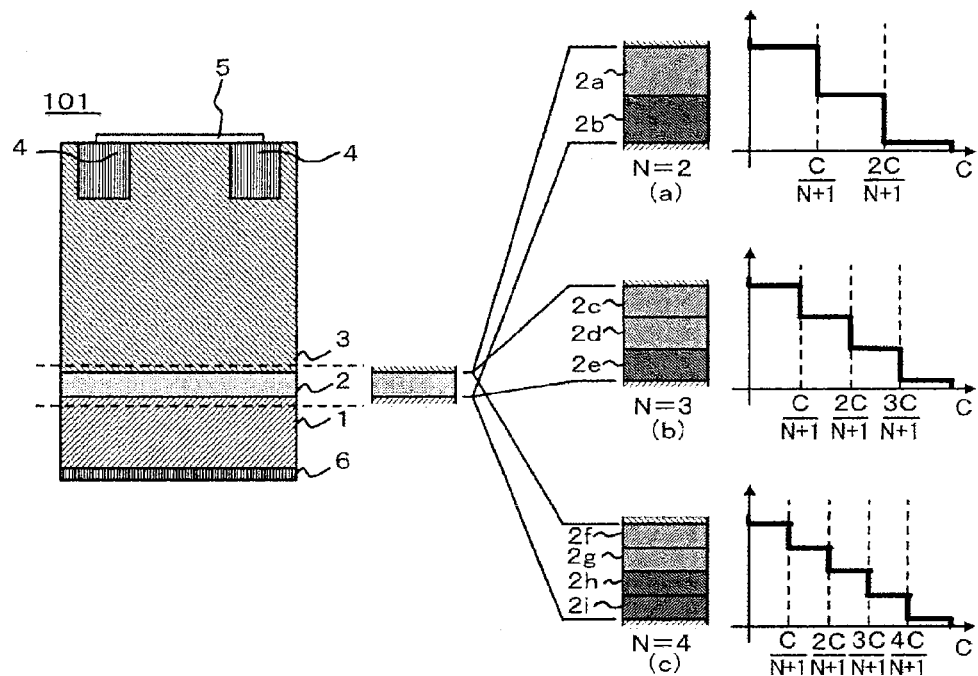
FIG. 1 is a cross-sectional view showing the structure of a semiconductor element according to a first embodiment of the present invention.
Figure 2:
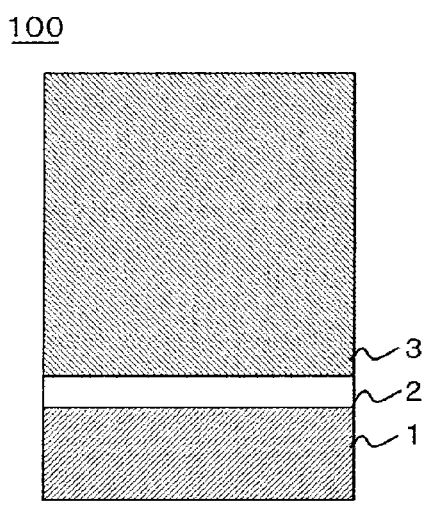
FIG. 2 is a cross-sectional view showing the structure of an epitaxial wafer according to the first embodiment of the present invention.

FIG. 1 is a cross-sectional view showing the configuration of a semiconductor element according to a first embodiment of the present invention. FIG. 2 is a cross-sectional view showing the configuration of an epitaxial wafer according to the first embodiment of the present invention.

With reference to FIG. 2, an epitaxial wafer 100 includes an n-type low-resistance silicon carbide substrate 1 of a first conductivity type that has an off-angle from a (0001) plane, an n-type buffer layer 2 formed on the silicon carbide substrate 1, and an epitaxially-grown layer 3 formed on the buffer layer 2 by epitaxial growth. The configuration of the buffer layer 2 is described below in detail.

With the use of the epitaxial wafer 100, a silicon carbide Schottky barrier diode 101 being the semiconductor element shown in FIG. 1 is formed. In the Schottky barrier diode 101, the epitaxially-grown layer 3 of the epitaxial wafer 100 serves as an n-type drift layer for maintaining the breakdown voltage. The drift layer 3 has a thickness of approximately 3 to 150 μm and a doping concentration of approximately 0.5 to $20 \times 10^{15}$ cm$^{-3}$, which is formed to be lower than the doping concentration of the silicon carbide substrate 1. In a portion in the vicinity of the element of the Schottky barrier diode 101, a p-type region 4 of a second conductivity type is formed as the termination structure. The p-type region 4 is selectively formed in the epitaxially-grown layer 3 of the epitaxial wafer 100 by ion implantation and activation heat treatment to have a thickness of approximately 0.5 to 2 μm and a doping concentration of approximately 1 to $100 \times 10^{17}$ cm$^{-3}$. An anode electrode 5 is formed on the drift layer 3 so as to be in contact with the p-type region 4 as well. Further, a cathode electrode 6 is formed on the back surface of the n-type low-resistance silicon carbide substrate 1.

The anode electrode 5 is in Schottky contact with the drift layer 3 and may be in Schottky contact or ohmic contact with the p-type region 4. In order to allow the anode electrode 5 to function as an ohmic electrode for the p-type region 4, it is possible to reduce a rise of the on-voltage caused by a contact portion when a current flows via the p-type region 4 by setting a contact resistance value to be equal to or smaller than $10^{-3}$ Ωcm$^2$. More desirably, a contact resistance value of $10^{-4}$ Ωcm$^2$ or smaller makes a voltage rise caused by the contact portion almost negligible.

The silicon carbide substrate 1 is desirably has a resistivity as low as possible for avoiding an increase in element resistance, and a group V element is doped at a high concentration. Too high doping concentration facilitates the introduction of a crystal defect, and accordingly, doping is normally performed to obtain a concentration of about $10^{19}$ cm$^{-3}$. In the present embodiment, an element that has a smaller lattice constant of silicon carbide crystal as doping is performed at a higher concentration, such as nitrogen, is used as the dopant of the silicon carbide substrate 1.

The buffer layer 2 has a configuration as shown in parts (a) to (c) of FIG. 1. In graphs shown in parts (a) to (c) of FIG. 1, a vertical axis and a horizontal axis represent a distance in a thickness direction and a nitrogen concentration, respectively. The buffer layer 2 is formed to have a multi-layer structure in which two or more layers having different doping concentrations and approximately the same thickness are laminated, and the dopant of the buffer layer 2 is identical to the dopant of the silicon carbide substrate 1. Note that "layers having approximately the same thickness" means to allow a manufacturing error as long as the effects of the present invention are achieved. If N represents the number of layers constituting the buffer layer 2 and C represents the doping concentration of nitrogen of the silicon carbide substrate 1, the respective layers are laminated such that the doping concentration of the K-th layer from the drift layer 3 side is expressed as K·C/(N+1). The possible range of K is 1 ≤K≤N.

Part (a) of FIG. 1 shows the concentration distribution of the buffer layer 2 in a case where the buffer layer 2 is composed of two layers. In this case, the buffer layer 2 is composed of two layers including a drift-layer-side layer 2a and a substrate-side layer 2b and, if the nitrogen concentration of the silicon carbide substrate 1 is $10^{19}$ cm$^{-3}$, the doping concentrations of the drift-layer-side layer 2a and substrate-side layer 2b are $3.3 \times 10^{18}$ cm$^{-3}$ and $6.7 \times 10^{18}$ cm$^{-3}$, respectively.

Part (b) of FIG. 1 shows the concentration distribution of the buffer layer 2 in a case where the buffer layer 2 is composed of three layers. In this case, the buffer layer 2 is composed of three layers including a drift-layer-side layer 2c, an interlayer 2d and a substrate-side layer 2e and, if the nitrogen concentration of the silicon carbide substrate 1 is $10^{19}$ cm$^{-3}$, the doping concentrations of the drift-layer-side layer 2c, interlayer 2d and substrate-side layer 2e are $2.5 \times 10^{18}$ cm$^{-3}$, $5 \times 10^{18}$ cm$^{-3}$ and $7.5 \times 10^{18}$ cm$^{-3}$, respectively.

Part (c) of FIG. 1 shows the concentration distribution of the buffer layer 2 in a case where the buffer layer 2 is composed of four layers. In this case, the buffer layer 2 is composed of a drift-layer-side layer 2f, a drift-layer-side interlayer 2g, a substrate-side interlayer 2h and a substrate-side layer 2i and, if the nitrogen concentration of the silicon carbide substrate 1 is $10^{19}$ cm$^{-3}$, the doping concentrations of the drift-layer-side layer 2f, drift-layer-side interlayer 2g, substrate-side interlayer 2h and substrate-side layer 2i are $2 \times 10^{18}$ cm$^{-3}$, $4 \times 10^{18}$ cm$^{-3}$, $6 \times 10^{18}$ cm$^{-3}$ and $8 \times 10^{18}$ cm$^{-3}$, respectively.

Three types of examples in which the number N of layers constituting the buffer layer 2 is two, three and four have been described above, which may be other configuration in which the number N is a value other than the above-mentioned values. The buffer layer 2 has a multi-layer structure that has a doping concentration decreasing stepwise at linear scale at approximately equal intervals and has approximately the same layer thickness in this manner, and accordingly, a lattice constant difference between the silicon carbide substrate 1 and the drift layer 3 is almost evenly split into (N+1) stages. As a result, the lattice constant of the buffer layer 2 decreases with an almost identical lattice constant difference from the silicon carbide substrate 1 toward the drift layer 3, which effectively mitigates the effects of lattice misfit due to a lattice constant difference between the silicon carbide substrate 1 and the drift layer 3.

In a case where the dopant is nitrogen, an increased doping concentration reduces the lattice constant of silicon carbide, and thus, the lattice constant of the drift layer 3 being an epitaxially-grown layer becomes larger than that of the silicon carbide substrate 1. Accordingly, in the buffer layer 2, a compressive stress acts in the horizontal direction, and a tensile stress acts in the growth direction, that is, thickness direction of the epitaxially-grown layer. In this manner, the impurity concentration of the buffer layer 2 is made such that the lattice constant changes stepwise at linear scale with an almost identical change amount, and accordingly, the contraction and tensile stresses are balanced in the growth direction of crystal in cooling to a room temperature after the epitaxial growth. As a result, the crystal defect does not extend in the growth direction but extends in the direction parallel to the interface between the respective layers constituting the buffer layer 2 or between the silicon carbide substrate 1 or the drift layer 3 and the buffer layer 2 even when the crystal defect occurs, whereby it is possible to prevent the generation of a crystal defect in the epitaxially-grown layer. Therefore, the carrier mobility does not decrease, and a semiconductor element having a small element resistance can be achieved.

In a case where the respective layers constituting the buffer layer 2 have a thickness of 100 nm or smaller, which is a much smaller value than the thickness of the drift layer 3, it is possible to prevent an increase in element resistance caused by the introduction of the buffer layer 2.

Second Embodiment

Figure 3:
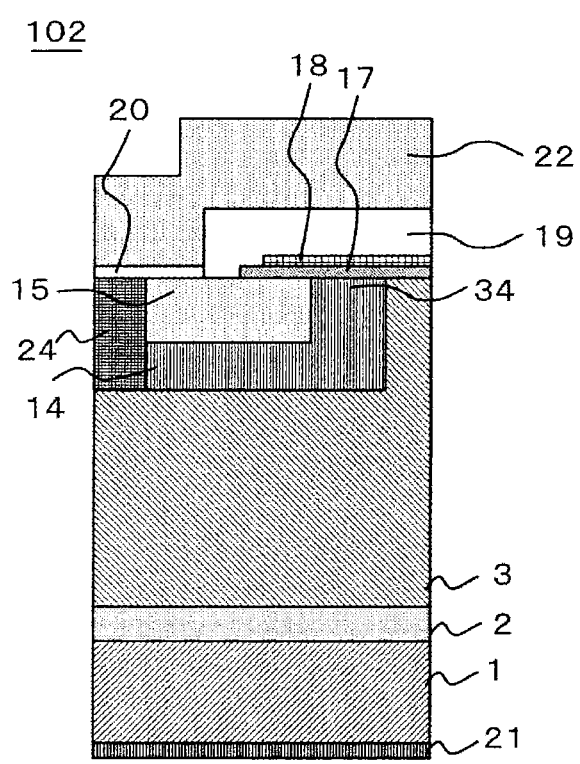
FIG. 3 is a cross-sectional view showing the structure of a semiconductor element according to a second embodiment of the present invention.

FIG. 3 is a cross-sectional view showing the configuration of a semiconductor element according to a second embodiment of the present invention.

With reference to FIG. 3, a silicon carbide MOSFET 102 being a semiconductor element is formed of the epitaxial wafer 100 including the n-type low-resistance silicon carbide substrate 1 having an off-angle from a (0001) plane, the n-type buffer layer 2 formed on the silicon carbide substrate 1, and the epitaxially-grown layer 3 formed on the buffer layer 2 by epitaxial growth, as in the first embodiment. Note that the configuration of the buffer layer 2 is similar to that of the first embodiment, and also similarly to the first embodiment, the epitaxially-grown layer 3 functions as an n-type silicon carbide drift layer for maintaining a breakdown voltage.

A p-type silicon carbide body region 14 and an n-type silicon carbide source region 15 are selectively formed in the n-type drift layer 3 by ion implantation and activation heat treatment. The body region 14 has a layer thickness of approximately 0.5 to 2 μm and a doping concentration of approximately 3 to 20×10$^{17}$ cm$^{-3}$, which may be configured to have a lower doping concentration on the uppermost surface on which a channel is formed or which is adjacent to a channel. Scattering due to impurities is reduced when the doping concentration on the uppermost surface is decreased, which increases the carrier mobility in the channel and decreases the element resistance. Ion implantation may be separately and selectively performed only on the uppermost surface region of the contact region 2 in the body region 14 for doping at a higher concentration compared with other portions, such as, approximately 5 to 50×10$^{18}$ cm$^{-3}$. The source region 15 has a layer thickness of approximately 0.3 to 1 μm and a doping concentration of approximately 5 to 50×10$^{18}$ cm$^{-3}$.

A gate insulating film 17 and a gate electrode 18 are formed on this layer structure, to thereby produce a gate portion. While a channel layer is not provided in the MOSFET 102 shown in FIG. 3, the channel layer may be provided separately. In the case of providing the channel layer, the conductivity type thereof may be n-type or p-type and, for improving the surface roughness caused by the activation heat treatment of ion implantation species, the formation by, for example, epitaxial growth is desired. Meanwhile, if surface roughness caused by the activation heat treatment is little, the structure may be made such that a channel layer is formed by selective ion implantation.

The activation heat treatment of ion implantation species may be performed at once, or activation heat treatment may be performed for each of the implantation steps.

The gate insulating film 17 is formed of, for example, a silicon oxide film or silicon oxynitride film to have a thickness of approximately 10 to 100 nm in a portion of the body region, which is opposed to the region 34 that becomes a channel, by thermal oxidation or nitriding of a silicon carbide semiconductor, by formation through deposition of an insulating film, or by a combined use of them.

The gate electrode 18 is formed by deposition of a polycrystalline silicon film or metal film. The channel layer (not shown), gate insulating film 17 and gate electrode 18 are removed from the region other than the gate portion. As to the channel layer, the region other than the gate portion may be removed before the formation of the gate insulating film 17. After the formation of an interlayer insulating film 19, the interlayer insulating film in the region that becomes the contact portion of a source electrode 20 is removed, and then the source electrode 20 is formed. Further, a drain electrode 21 is formed on the back surface of the n-type substrate 1, and an interconnect 22 is formed on the source electrode 20 and the interlayer insulating film 19. Though not shown, the interconnect 22 on the interlayer insulating film is removed in a partial region of the outer peripheral portion of the element in which a gate electrode pad is formed.

The buffer layer 2 has a similar configuration to that of the first embodiment shown in FIG. 1, where the buffer layer 2 is configured to have a multi-layer structure in which the doping concentration gradually decreases stepwise at linear scale at approximately equal intervals and the thickness is approximately the same, so that the introduction of a crystal defect into the drift layer 3 being an epitaxially-grown layer can be prevented. Accordingly, the carrier mobility does not decrease, which prevents an increase in element resistance.

The respective layers constituting the buffer layer 2 have a thickness of 100 nm or smaller, which is a much smaller value than the thickness of the drift layer 3, whereby it is possible to prevent an increase in element resistance caused by the introduction of the buffer layer 2.

While the plane orientation of the silicon carbide substrate 1 is a plane having an off-angle from a (0001) plane in the first and second embodiments above, the buffer layer having the configuration shown in FIG. 1 can prevent the introduction of a crystal defect into the epitaxially-grown layer and an increase in element resistance also in every crystal orientation such as a (0001) plane with no off-angle, (000-1) plane, (11-20) plane or (03-38).

While the first and second embodiments have described the example in which the dopant is nitrogen, even if the dopant is not nitrogen as long as it is a dopant in which the lattice constant of silicon carbide crystal decreases by doping, the buffer layer having the configuration shown in FIG. 1 can prevent the introduction of a crystal defect into the epitaxially-grown layer and an increase element resistance.

The invention claimed is:

1. An epitaxial wafer, comprising:
   i) a silicon carbide substrate of a first conductivity type, wherein the silicon carbide substrate is doped with a dopant at a concentration C, and has a lattice constant that decreases with doping and has an off-angle from a (0001) plane;
   ii) a buffer layer of the first conductivity type located on the substrate, which is doped with the dopant; and iii) a silicon carbide epitaxially-grown layer of the first conductivity type located on the buffer layer, which is doped with the dopant at a concentration smaller than the concentration of the silicon carbide substrate, wherein the buffer layer has a multi-layer structure comprising three or more layers having approximately a same thickness which are laminated together, wherein a doping concentration of a K-th layer of the buffer layer from the silicon carbide epitaxially-grown layer side is $C \cdot K/(N+1)$ so that the doping concentration increases stepwise in a linear scale at equal intervals to the silicon carbide substrate, wherein N is the number of layers in the multi-layer structure, wherein each of the layers of the buffer layer has a thickness of 100 nm or smaller but greater than zero, and wherein a lattice constant of each of the layers of the buffer layer decreases with an almost identical lattice constant difference from the silicon carbide substrate to the silicon carbide epitaxially-grown layer.

2. The epitaxial wafer of claim 1, wherein the dopant is nitrogen.

3. The epitaxial wafer of claim 1, wherein N is 3.

4. The epitaxial wafer of claim 1, wherein N is 4.

* * * * *